(12) United States Patent
Huang

(10) Patent No.: US 6,574,261 B2
(45) Date of Patent: Jun. 3, 2003

(54) DISTRIBUTED FEEDBACK SEMICONDUCTOR LASER

(75) Inventor: Yidong Huang, Tokyo (JP)

(73) Assignee: NEC Corporation, Tokyo (JP)

(*) Notice: Subject to any disclaimer, the term of this patent is extended or adjusted under 35 U.S.C. 154(b) by 33 days.

(21) Appl. No.: 09/984,051

(22) Filed: Oct. 26, 2001

(65) Prior Publication Data

US 2002/0027938 A1 Mar. 7, 2002

Related U.S. Application Data

(63) Continuation-in-part of application No. 09/382,700, filed on Aug. 25, 1999, now Pat. No. 6,330,268.

(30) Foreign Application Priority Data

Aug. 27, 1998 (JP) .......................................... 10-242281

(51) Int. Cl.[7] ................................................ H01S 5/12
(52) U.S. Cl. ........................... 372/96; 372/46; 372/102
(58) Field of Search ........................... 372/96, 46, 102, 372/50

(56) References Cited

U.S. PATENT DOCUMENTS

| 4,847,856 A | 7/1989 | Sugimura et al. ............. 372/96 |
| 5,943,554 A | 8/1999 | Dautremont-Smith et al. ... 438/32 |
| 6,111,906 A * | 8/2000 | Muroya ........................ 372/96 |
| 6,175,581 B1 | 1/2001 | Sato ............................. 372/44 |

FOREIGN PATENT DOCUMENTS

| JP | 60-178685 | 9/1985 |
| JP | 63-32988 | 2/1988 |
| JP | 64-15687 | 2/1989 |
| JP | 1-194380 | 8/1989 |
| JP | 1-239892 | 9/1989 |
| JP | 2-47887 | 2/1990 |
| JP | 2-77185 | 3/1990 |
| JP | 4-17384 | 1/1992 |
| JP | 4-229687 | 8/1992 |
| JP | 5-48197 | 2/1993 |
| JP | 7-335971 | 12/1995 |
| JP | 9-283841 | 10/1997 |
| JP | 10-41587 | 2/1998 |

OTHER PUBLICATIONS

"Quantum Elecronics", IEEE Journal, vol. 27, No. 6, Jun. 1991, pp. 1767–1772.

* cited by examiner

Primary Examiner—James Davie
(74) Attorney, Agent, or Firm—Sughrue Mion, PLLC

(57) ABSTRACT

A distributed feedback semiconductor laser (DFB laser) in which light feedback is performed by using a diffraction grating, and in which influence of external feedback noises can be decreased to suppress fluctuation of an optical output. The DFB laser comprises a diffraction grating structure portion which constitutes a resonator and which is divided into a plurality of regions along the longitudinal direction of the resonator, and one or more phase shift portions each disposed between adjacent regions of the diffraction grating structure portion, wherein total phase shift obtained by all of the phase shift portions has a quantity corresponding to $\lambda/n$, where $\lambda$ is an oscillation wavelength, and n is an integer larger than 4 (n>4) and less than or equal to 16 (n≤16). The total phase shift may have a quantity corresponding to a value within a range between $\lambda/5$ and $\lambda/8$.

15 Claims, 11 Drawing Sheets

DISTRIBUTED FEEDBACK
SEMICONDUCTOR LASER

This application is a Continuation In Part (CIP) of application Ser. No. 09/382,700 filed on Aug. 25, 1999 is now U.S. Pat. No. 6,330,268 which is incorporated herein by reference.

FIELD OF THE INVENTION

The present invention relates generally to a distributed feedback semiconductor laser (hereafter referred to also as "DFB laser") in which optical feedback or light feedback is performed by using a diffraction grating, and more particularly to a DFB laser in which return light induced noises or external feedback noises can be decreased to reduce fluctuation of an optical output thereof.

BACKGROUND OF THE INVENTION

Conventionally, a semiconductor laser is used as a light source for optical communication. A part of a laser light emitted from the light source is reflected by one or more optical components such as an optical connector and the like disposed on an optical path. When a reflected return light (or reflection return light, or external optical feedback), that is, a light reflected by the optical components and returning backward, is incident on the semiconductor laser as the light source, return light induced noises or external optical feedback induced noises are produced within the semiconductor laser. That is, optical output level of the semiconductor laser fluctuates. When the optical output fluctuates, there arises a possibility of transmission code error.

As a method of preventing the reflected return light from entering the semiconductor laser, it is considered possible to provide an optical isolator on the side of the emission end or the outlet end of the semiconductor laser. However, when the optical isolator is used, the optical isolator is itself expensive, and manufacturing process of the light source also becomes complicated, so that manufacturing cost of the light source becomes high.

Therefore, a DFB laser is proposed in which generation of the return light induced noises can be suppressed without using the optical isolator. One example of such DFB laser is disclosed in a document 1, i.e., Japanese patent laid-open publication No. 4-17384 (Japanese patent application No. 2-120026). According to a technique disclosed in this document 1, a DFB laser, in which optical feedback or light feedback is performed by using a diffraction grating, is divided into two regions along the length of a resonator thereof. Also, one of the regions on the side of the emission end is used as a non-excitation region, and the other region is used as an excitation region, that is, a current injection region. Therefore, an electrode for injecting current are provided only on the upper surface of the excitation region. By using such structure, it is possible to utilize a diffraction grating of the non-excitation region as a distributed reflector. As a result, it is possible to prevent the reflected return light from coming into an active layer of the DFB laser.

However, in the technique disclosed in the above-mentioned document 1, reflectance of the distributed reflector in the non-excitation region, for the output emission light of the DFB laser is the same as reflectance for the reflected return light. As a result, when the reflectance of the distributed reflector is made high, optical loss in the non-excitation region also becomes large, and an oscillation threshold of the DFB laser becomes high. Therefore, it becomes difficult to sufficiently suppress incidence of the reflected return light into an active layer.

SUMMARY OF THE INVENTION

It is therefore an object of the present invention to obviate the above-mentioned disadvantages of the conventional distributed feedback semiconductor laser (DFB laser).

It is another object of the present invention to provide a DFB laser which has a high immunity against reflected return light.

It is still another object of the present invention to provide a DFB laser in which fluctuation of an optical output of the DFB laser caused by the reflected return light can be suppressed.

In order to attain the above-mentioned objects of the present invention, the inventor of the present invention found, after performing various experimentation and consideration, a phenomenon that quantity of detuning of a semiconductor laser exhibits a fluctuation of opposite phase to a fluctuation of an optical output, when the optical output of the semiconductor laser fluctuates.

In this case, the quantity of detuning $\delta\beta$ is designated by the following formula.

$$\delta\beta = 2n_{eq}\pi((1/\lambda)-(1/\lambda_B)) \quad (1)$$

where, $n_{eq}$ designates an equivalent refractive index of an active layer of a semiconductor laser, $\lambda$ designates an oscillation wavelength of the semiconductor laser, and $\lambda_B$ designates Bragg wavelength.

Therefore, the inventor thought out that, by suppressing the fluctuation of the optical output caused by the reflected return light by utilizing the phenomenon that quantity of detuning of a semiconductor laser exhibits a fluctuation of opposite phase to a fluctuation of an optical output, it is possible to improve the immunity of a semiconductor laser against the reflected return light. Also, the inventor derived the condition that optical output fluctuation caused by the fluctuation of the quantity of detuning of a distributed feedback semiconductor laser becomes a negative feedback with respect to optical output fluctuation caused by the reflected return light, and thereby thought out a technical idea of the present invention described below.

According to an aspect of the present invention, there is provided a distributed feedback semiconductor laser comprising: a diffraction grating structure portion which constitutes a resonator and which is divided into a plurality of regions along the longitudinal direction of the resonator; and one or more phase shift portions each disposed between adjacent regions of the diffraction grating structure portion; wherein total phase shift obtained by all of the phase shift portions has a quantity corresponding to $\lambda/n$, where $\lambda$ is an oscillation wavelength, and n is an integer larger than 4 (n>4).

As mentioned above, when the optical output of a semiconductor laser fluctuates, the quantity of detuning fluctuates in the opposite phase to that of the fluctuation of the optical output. When the quantity of detuning fluctuates, quantity of reflecting mirror loss which determines an oscillation mode also fluctuates according to the fluctuation of quantity of detuning. When the quantity of reflecting mirror loss fluctuates, an intensity of light emission of a semiconductor laser also fluctuates.

When the quantity of the reflecting mirror loss increases, the optical output of the semiconductor laser decreases. On the other hand, when the reflecting mirror loss decreases, the optical output of the semiconductor laser increases. Therefore, depending on the direction of the fluctuation of the quantity of reflecting mirror loss due to the fluctuation of the quantity of detuning, fluctuation of the optical output caused by the reflected return light is amplified or suppressed.

It is known that the direction of the fluctuation of the reflecting mirror loss with respect to the fluctuation of the quantity of detuning depends on the quantity of phase shift provided at the diffraction grating structure portion of a DFB laser. That is, when the phase shift is larger than a quantity corresponding to $\lambda/4$, where $\lambda$ designates an oscillation wavelength, the reflecting mirror loss decreases (increases), in accordance with the decrease (increase) of the quantity of the detuning, respectively. Therefore, when the optical output of the semiconductor laser increases due to the reflected return light, the quantity of detuning decreases and the reflection mirror loss also decreases. As a result, the optical output of the semiconductor laser further increases. That is, the fluctuation of the optical output due to the reflected return light is amplified. Thus, when the phase shift is larger than $\lambda/4$, positive feedback phenomenon occurs.

On the other hand, when the phase shift is smaller than the quantity corresponding to $\lambda/4$, it is known that the reflecting mirror loss increases (decreases), according to the decrease (increase) of the quantity of detuning, respectively. Therefore, when the optical output of the semiconductor laser has increased due to the reflected return light, the quantity of detuning decreases and the reflection mirror loss increases. As a result, the optical output of the semiconductor laser fluctuates toward decrease. That is, increase in the optical output due to the reflected return light is suppressed. Thus, when the phase shift is smaller than $\lambda/4$, negative feedback phenomenon occurs.

Therefore, by making the phase shift smaller than the quantity corresponding to $\lambda/4$, it is possible to suppress the fluctuation of the optical output of the DFB laser caused by the reflected return light. That is, it is possible to improve immunity against the reflected return light of the DFB laser.

It is preferable that the total phase shift has a quantity corresponding to a value within a range between $\lambda/4$ and $\lambda/16$ and more preferably between $\lambda/5$ and $\lambda/8$.

In the negative feedback region in which the phase shift is smaller than $\lambda/4$, the smaller the phase shift, the larger the fluctuation of the reflecting mirror loss with respect to the fluctuation of the quantity of detuning. Therefore, when the total phase shift is made equal to or smaller than $\lambda/5$, it is possible to secure enough magnitude of the fluctuation of the reflecting mirror loss with respect to the fluctuation of the quantity of detuning. As a result, it is possible to sufficiently suppress the fluctuation of the optical output caused by the reflected return light.

Also, if the phase shift is made equal to or larger than $\lambda/8$, it is possible to keep the fluctuation of the reflecting mirror loss equal to or smaller than a predetermined quantity, when the quantity of detuning fluctuates. As a result, it becomes possible to prevent the quantity of fluctuation of the optical output due to the negative feedback from largely exceeding the quantity of fluctuation of the optical output caused by the reflected return light.

Therefore, if the total phase shift is made to have a quantity corresponding to a value within a range from $\lambda/8$ to $\lambda/5$, that is, a range between a value equal to or larger than $\lambda/8$ and a value equal to or smaller than $\lambda/5$, the fluctuation of the optical output caused by the reflected return light can be effectively suppressed.

Also, it is preferable that the diffraction grating structure portion is divided into a first region and a second region and that a phase shift portion is provided between the first and second regions.

By using a structure in which two regions of diffraction grating structure are provided, that is, by using a structure in which one portion of the phase shift portion is provided therebetween, the structure of the DFB laser can be simplified.

It is also preferable that the phase shift portion is disposed at the central portion along the longitudinal direction of the resonator, that an average period of all of said regions of the diffraction grating structure portion is determined as a reference period, that a period of the first region of the diffraction grating structure portion is increased with respect to the reference period, and a period of the second region of the diffraction grating structure portion is decreased with respect to the reference period, and that an increment of the period of the diffraction grating structure portion in the first region and a decrement of said period of said diffraction grating structure portion in the second region at any equal distances from the phase shift portion are equal to each other.

If the diffraction grating of the DFB laser has the above-mentioned structure, it is possible to mitigate concentration of electric field in the phase shift portion, and to make an internal electric field of the DFB laser uniform. As a result, it becomes possible to make carrier distribution uniform and, therefore, to suppress occurrence of spatial hole burning.

It is preferable that the phase shift portion is disposed at a portion shifted toward the front end surface from the central portion along the longitudinal direction of the resonator.

By providing the phase shift portion at a location near the front end surface, it is possible to raise an electric field strength near the front end surface which is an emission end surface of the DFB laser. Therefore, an output efficiency of the DFB laser can be improved.

It is also possible to divide the diffraction grating structure portion is into at least three regions and to provide a phase shift portion each between adjacent regions.

By providing a plurality of phase shift portions, it is possible to mitigate concentration of electric field in the phase shift portions, and to make an internal electric field of the DFB laser uniform. As a result, it becomes possible to make carrier distribution uniform and, therefore, to suppress occurrence of spatial hole burning.

It is preferable that the phase shift portion has a phase shifting diffraction grating structure which has a period different from that of the diffraction grating structure portion in the plurality of regions.

By making a phase shift portion have diffraction grating structure having different period in this way, it is possible to make the width of the phase shift portion along the length of the resonator large. To this end, it is possible to mitigate concentration of electric field in the phase shift portion, and to make an internal electric field of the DFB laser uniform. As a result, it becomes possible to make carrier distribution uniform and, therefore, to suppress occurrence of spatial hole burning.

Also, it is preferable that the diffraction grating structure portion is formed at an interface portion between an optical guide layer and another layer adjacent the optical guide layer.

Further, it is preferable that the diffraction grating structure portion has a diffraction grating structure of gain coupling type in which optical gain distribution of an active layer varies periodically along the longitudinal direction of the resonator.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding pats throughout the figures, and in which.

DESCRIPTION OF A PREFERRED EMBODIMENT

With reference to the drawings, embodiments of the present invention will now be explained.

Figure 1:
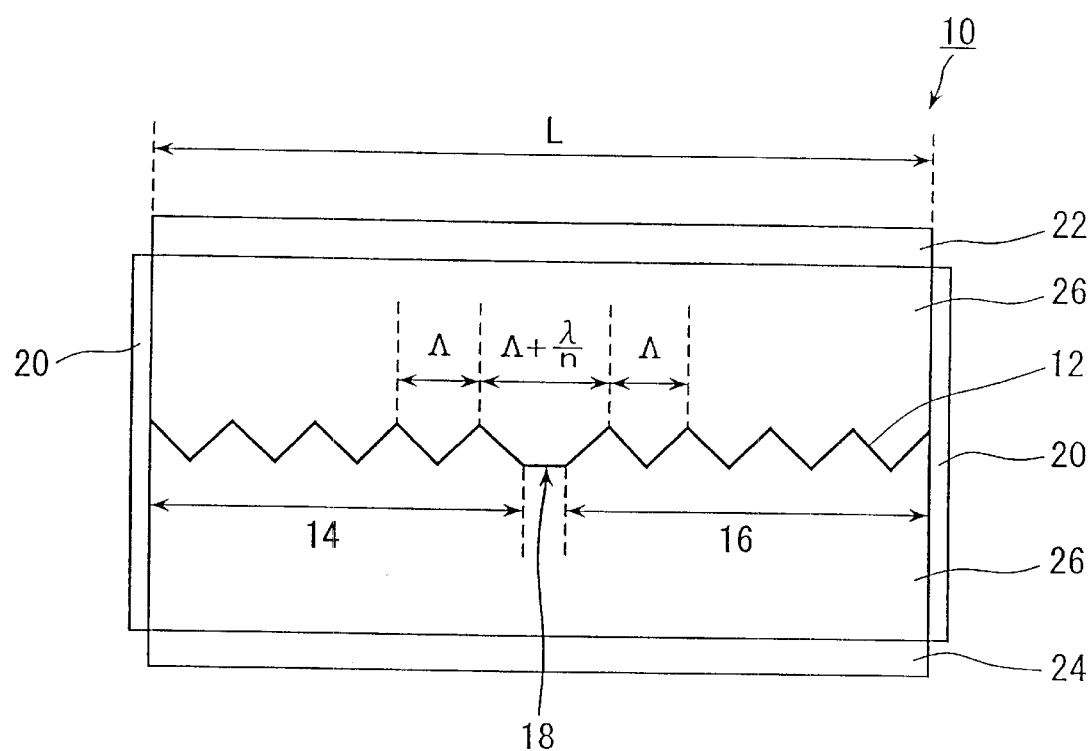
FIG. 1 is a schematic sectional view illustrating a structure of a resonator of a DFB laser according to an embodiment of the present invention.

First, with reference to FIG. 1, an embodiment of a DFB laser will be explained. FIG. 1 is a schematic sectional view illustrating the DFB laser as an embodiment of the present invention. In FIG. 1, detailed illustration of semiconductor stacked structures 26 formed on and under a diffraction grating structure portion of the DFB laser is omitted for the sake of simplicity.

In the DFB laser according to this embodiment, a diffraction grating structure portion 12 constituting a resonator 10 is divided into two regions along the longitudinal direction of the resonator, i.e., a first region 14 and a second region 16. Also, a phase shift portion 18 is provided between the first region 14 and the second region 16. Quantity of phase shift in the phase shift portion 18 is adjusted to a value corresponding to $\lambda/n$, for example, $\lambda/8$ (n=8). Where, $\lambda$ designates an oscillation wavelength, and n is an integer larger than 4 (n>4). Preferably n is an integer in the range of $4<n\leq16$ and more preferably n is an integer in the range of $5\leq n\leq 8$.

Also, a length of the resonator 10 is designated as L, and a period (pitch) of the diffraction grating structure portion 12 is designated as $\Lambda$ (lambda). Further, as the phase shift portion 18, a flat surface is provided whose width along the longitudinal direction of the resonator is $\lambda/n$. As a result, as shown in FIG. 1, a distance between a peak portion of the diffraction grating in the first region 14 adjacent the phase shift portion 18 and a peak portion of the diffraction grating in the second region 16 adjacent the phase shift portion 18 becomes $(\Lambda+\lambda/n)$.

It is not always necessary to provide the flat surface in the phase shift portion 18. For example, it is possible to adjacently dispose the first region 14 and the second region 16, and to adjust the phase difference between the diffraction gratings in both regions to $\lambda/n$.

On each of the front end surface and the rear end surface of the resonator 10, there is provided an antireflection (AR) film 20. Also, on an upper surface of the resonator 10 and on the lower surface or back surface of the resonator 10, there are provided an upper surface electrode 22 and a back surface electrode 24, respectively. A voltage is applied between the upper electrode 22 and the back electrode 24 and thereby a current is injected into the DFB laser, so that the DFB laser oscillates.

Now explanation will be made on a condition concerning the quantity of phase shift in the DFB laser according to the present invention.

Figure 3:
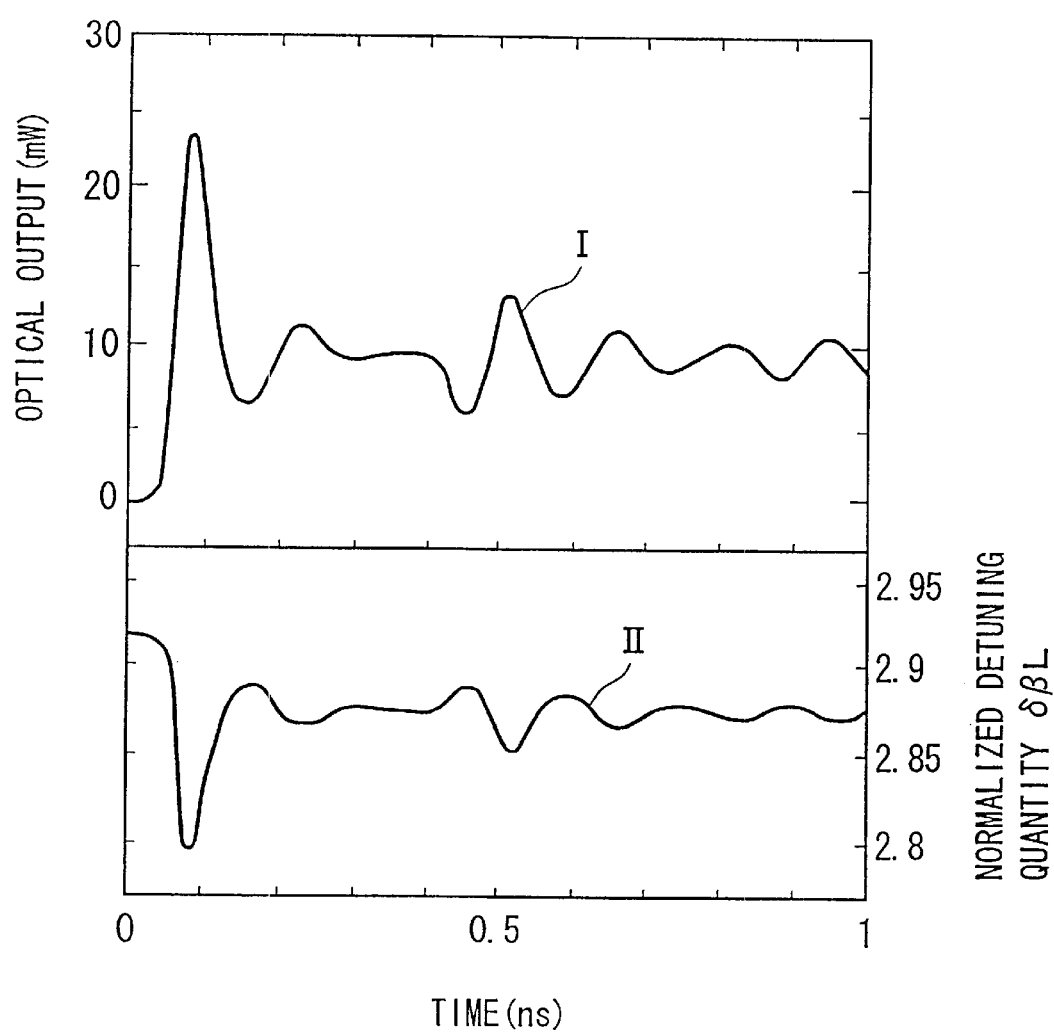
FIG. 3 is a graph showing a relation between fluctuation of an optical output of a DFB laser and fluctuation of quantity of detuning.

FIG. 3 shows a relation between an optical output of the DFB laser and a quantity of detuning, calculated by large signal response analysis. The abscissa of the graph of FIG. 3 designates time (ns), the ordinate on the left side designates an optical output (mW), and the ordinate on the right side designates a normalized quantity of detuning $\delta\beta L$.

When the optical output varies as shown by a curve I, the normalized quantity of detuning $\delta\beta L$ varies as shown by a curve II, with the lapse of time,. From the curves I and II, it can be seen that the normalized quantity of detuning varies in opposite phase to that of variation of the optical output. That is, when the optical output increases, the normalized quantity of detuning decreases. On the other hand, when the optical output decreases, the normalized quantity of detuning increases.

Figure 2A:
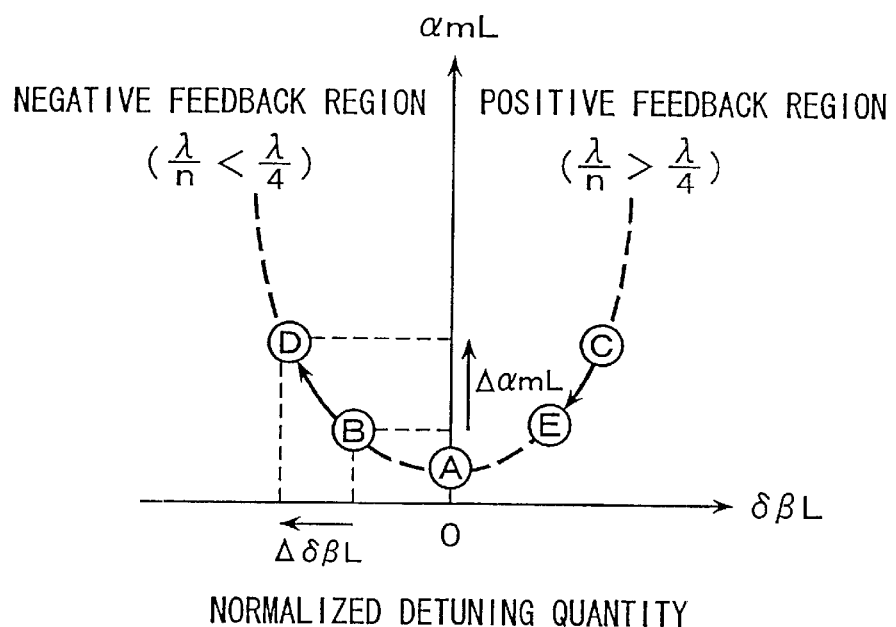
FIG. 2A and FIG. 2B are graphs illustrating relations between normalized quantity of detuning and normalized reflecting mirror loss.
Figure 2B:
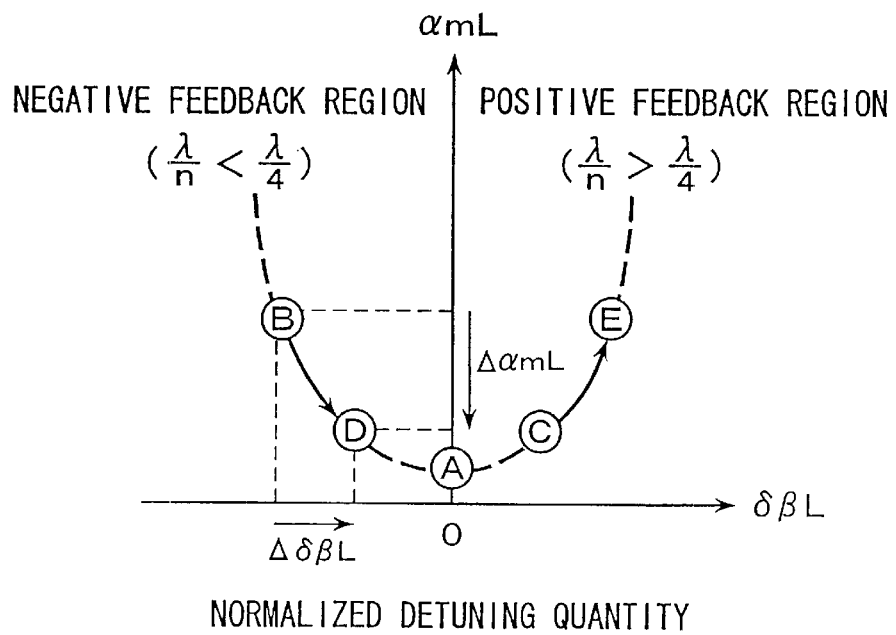

FIG. 2A and FIG. 2B show relations between the quantity of detuning and the reflecting mirror loss, by which oscillation mode or condition of the DFB laser is determined. In FIGS. 2A and 2B, each abscissa designates the normalized quantity of detuning $\delta\beta L$, and each ordinate designates the reflecting mirror loss $\alpha mL$. Also, when the quantity of phase shift corresponds to $\lambda/4$, the normalized quantity of detuning becomes 0 (zero).

When the reflectance of the antireflection film 20 is zero, condition of oscillation of the phase shift DFB laser, i.e., the DFB laser having a phase shift portion, does not depend on the phase of the diffraction grating at the end surface. An oscillation mode is shown by each point on the dotted lines of graphs of FIGS. 2A and 2B. In this case, for example, each of points A, B and C on the dotted lines corresponds to an oscillation mode in which there is no influence of the reflected return light.

Here, if a reflected return light is inputted to the phase shift DFB laser, an electric field within the resonator fluctuates. As a result, an optical output of the laser fluctuates, and carrier density and refractive index fluctuate. Therefore, oscillation condition, that is, the quantity of detuning and reflecting mirror loss, varies and thereby oscillation mode varies. When the oscillation mode varies, points corresponding to oscillation modes move on the dotted lines in the graph of FIGS. 2A and 2B.

For example, as shown in FIG. 2A and FIG. 2B, a point B of an oscillation mode moves to a point D on the dotted line, and, similarly, a point C moves to a point E. It should be noted that FIG. 2A corresponds to a case the normalized quantity of detuning decreases, and FIG. 2B corresponds to a case the normalized quantity of detuning increases.

Also, it is known that movement of oscillation mode points corresponds to the variation of the quantity of phase shift.

Next, consideration will be made on a case in which an optical output increases due to the influence of the reflected return light. When the optical output increases, the quantity of detuning decreases as shown in FIG. 3. If the quantity of detuning decreases, the reflecting mirror loss varies as shown in FIG. 2A. The reflecting mirror loss varies in two directions depending on the quantity of detuning.

First, when the normalized quantity of detuning is negative, that is, when the quantity of phase shift is smaller than $\lambda/4$, if the normalized quantity of detuning decreases by $\Delta\delta\beta L$, the normalized reflecting mirror loss increases by $\Delta\alpha mL$, which corresponds to a movement from the point B to the point D in FIG. 2A. If the reflecting mirror loss increases, the optical output decreases. Therefore, in this case, a negative feedback phenomenon occurs in which the optical output is decreased against the increase in the optical output caused by the reflected return light. That is, fluctuation of the optical output is suppressed.

On the other hand, when the normalized quantity of detuning is positive, that is, when the quantity of phase shift is larger than $\lambda/4$, if the normalized quantity of detuning decreases by $\Delta\alpha\beta L$, the normalized reflecting mirror loss also decreases by $\Delta\alpha mL$, which corresponds to a movement from the point C to the point E in FIG. 2A. If the reflecting mirror loss decreases, the optical output increases. Therefore, in this case, a positive feedback phenomenon occurs in which the optical output is further increased in response to the increase in the optical output caused by the reflected return light. That is, fluctuation of the optical output is promoted.

Consideration will now be made on a case in which an optical output decreases due to the influence of the reflected return light. When the optical output decreases, the quantity of detuning increases as shown in FIG. 3. If the quantity of detuning increases, the reflecting mirror loss varies as shown in FIG. 2B. The reflecting mirror loss varies in two directions depending on the quantity of detuning.

First, when the normalized quantity of detuning is negative, that is, when the quantity of phase shift is smaller than $\lambda/4$, if the normalized quantity of detuning increases by $\alpha\delta\beta L$, the normalized reflecting mirror loss decreases by $\Delta\alpha mL$, which corresponds to a movement from the point B to the point D in FIG. 2B. If the reflecting mirror loss decreases, the optical output increases. Therefore, in this case, a negative feedback phenomenon occurs in which the optical output is increased against the decrease in the optical output caused by the reflected return light. That is, fluctuation of the optical output is suppressed.

On the other hand, when the normalized quantity of detuning is positive, that is, when the quantity of phase shift is larger than $\lambda/4$, if the normalized quantity of detuning increases by $\Delta\delta\beta L$, the normalized reflecting mirror loss also increases by $\Delta\alpha\beta mL$, which corresponds to a movement from the point C to the point E in FIG. 2B. If the reflecting mirror loss increases, the optical output decreases. Therefore, in this case, a positive feedback phenomenon occurs in which the optical output is further decreased in response to the decrease in the optical output caused by the reflected return light. That is, fluctuation of the optical output is promoted.

From the considerations above, it can be seen that when the normalized quantity of detuning is negative, that is, when the quantity of phase shift is smaller than $\lambda/4$, the negative feedback phenomenon occurs and it becomes possible to suppress the fluctuation of the optical output caused by the reflected return light. That is, by setting the quantity of phase shift of the DFB laser so as to satisfy the above-mentioned condition, that is, by making the quantity of phase shift of the DFB laser smaller than $\lambda/4$, it becomes possible to improve immunity of the DFB laser against the reflected return light.

Now, consideration will be made on a case in which reflectance of each of both end surfaces of the resonator is not zero. In this case, oscillation condition of the phase shift DFB laser depends on the phase of the diffraction grating at the end surfaces.

Figure 4:
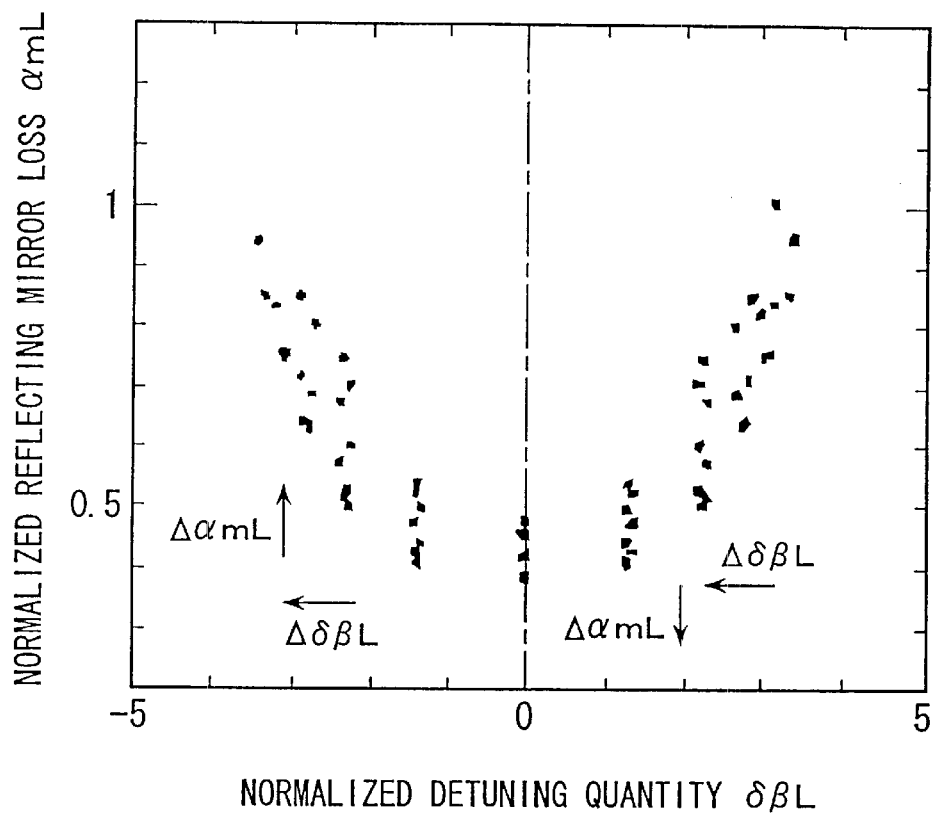
FIG. 4 is a graph showing a result of calculation of a relation between normalized quantity of detuning and reflecting mirror loss.

FIG. 4 shows a result of a relation between the quantity of detuning and the reflecting mirror loss calculated by using large signal response analysis. The abscissa of the graph of FIG. 4 designates the normalized quantity of detuning, and the ordinate designates the normalized reflecting mirror loss. In the calculation, the phase of the diffraction grating at each end surface is set to one of eight (8) phases obtained by dividing $2\pi$ by $\pi/4$. The eight phases are, 0, $\pi/4$, $\pi/2$, $3\pi/4$, $\pi$, $5\pi/4$, $6\pi/4$ and $7\pi/4$. Therefore, the calculation was performed for 8×8=64 kinds of combination of phases of the end surfaces. Also, each plot in FIG. 4 corresponds to an oscillation mode in each of the combination of the phases of the end surfaces. It can be seen that the plots in FIG. 4 are also distributed along the dotted lines of FIGS. 2A and 2B.

In case the reflectance of the end surfaces is not zero, when the normalized quantity of detuning $\delta\beta L$ is negative, that is, when the quantity of phase shift is smaller than $\lambda/4$, the negative feedback phenomenon occurs, similarly to the case the reflectance of the end surfaces is zero. For example, the negative feedback phenomenon occurs, in which, when the optical output increases (decreases) due to the reflected return light and the quantity of detuning decreases (increases), the reflecting mirror loss increases (decreases) and thereby the optical output is decreased (increased).

On the other hand, when the normalized quantity of detuning $\delta\beta L$ is positive, that is, when the quantity of phase shift is larger than $\lambda/4$, the positive feedback phenomenon occurs, similarly to the case the reflectance of the end surfaces is zero. For example, the positive feedback phenomenon occurs, in which, when the optical output increases (decreases) due to the reflected return light and the quantity of detuning decreases (increases), the reflecting mirror loss also decreases (increases) and thereby the optical output is further increased (decreased).

Therefore, regardless of the reflectance at the end surfaces, and, also, regardless of the phase at the end surfaces, when the quantity of phase shift is smaller than λ/4, the negative feedback phenomenon occurs and it is possible to suppress fluctuation of the optical output.

DESCRIPTION OF EXAMPLES

With reference to the examples, the present invention will now be described in further detail.

It should be noted that drawings referred hereafter show sizes, shapes, dispositions and so on of components of the inventive structures only schematically so as to facilitate understanding of the invention. Therefore, the present invention is not limited to the structures illustrated in the drawings.

EXAMPLE 1

Figure 5A:
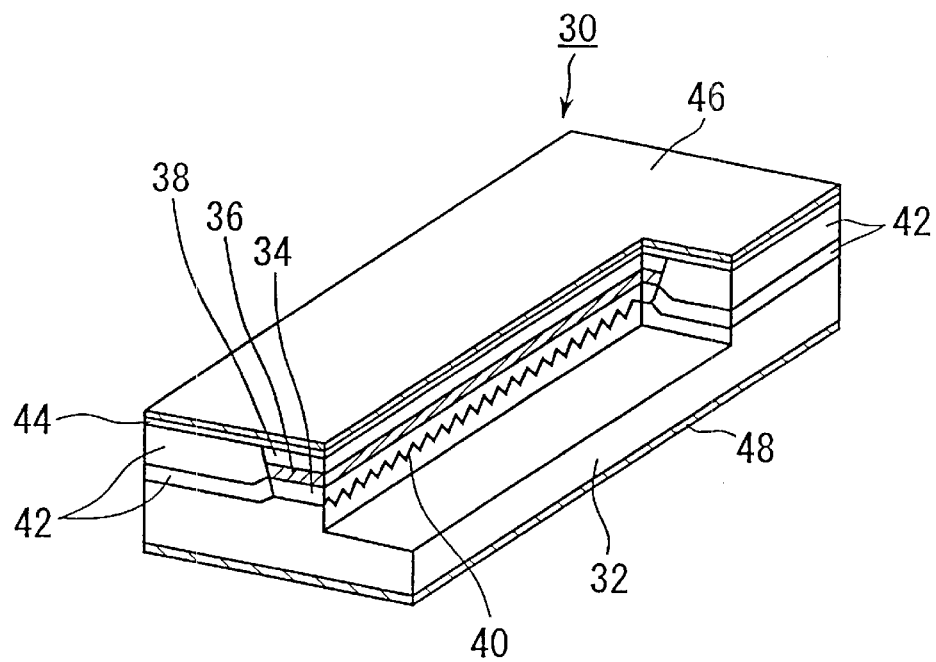
FIG. 5A is a partially cutaway perspective view illustrating a DFB laser according to another embodiment of the present invention.
Figure 5B:
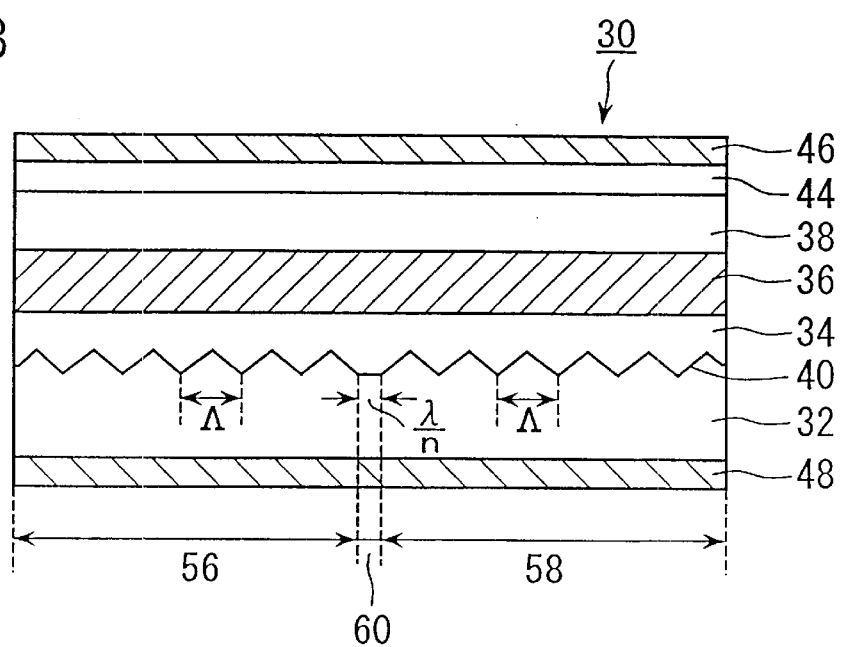
FIG. 5B is a schematic sectional view of the DFB laser shown in FIG. 5A.

With reference to FIG. 5A and FIG. 5B, an explanation will be made on a DFB laser according to an Example 1 which is generally designated by a reference numeral 30. FIG. 5A is a partially cutaway perspective view of the DFB laser 30 according to the Example 1. FIG. 5B is a schematic sectional view of the DFB laser 30 according to the Example 1 taken along the longitudinal direction of a resonator of the DFB laser 30.

As shown in FIGS. 5A and 5B, the DFB laser 30 has a resonator length of 250 micrometers (μm), and has a structure in which a light guide layer or an optical guide layer 34, an active layer 36, and a cladding layer 38 are sequentially stacked on an InP semiconductor substrate 32. The light guide layer 34 is made of InGaAsP and has a thickness of 0.1 micrometer. The active layer 36 has a multiple quantum well structure and has a thickness of 0.2 micrometers. The cladding layer 38 is made of InGaAsP and has a thickness of 3 micrometers. Each of these layers can be formed, for example, by using a well known epitaxial growth method.

Also, on both lateral sides of the light guide layer 34, the active layer 36 and the cladding layer 38, a current block layer 42 is formed. On the cladding layer 38 and the current block layer 42, there is formed a cap layer 44 made of InP and having a thickness of 3 micrometers.

Further, on the cap layer 44, there is formed an upper surface electrode 46, and on the back surface of the semiconductor substrate 32, there is formed a back surface electrode 48. Also, both end surfaces, i.e., front end surface and rear end surface, are coated with antireflection coating.

At the light guide layer 34, there is formed a diffraction grating structure portion 40. That is, a structure having a shape which is a repetition of periodical unevenness along the longitudinal direction of the resonator, for example, a triangular wave shape, is formed on the semiconductor substrate 32, on which the optical guide layer 34 is formed. Thereby, an interface portion between the optical guide layer 34 and the semiconductor substrate 32 constitutes the diffraction grating structure portion 40. The period (pitch) Λ of this diffraction grating structure portion 40 is 202.7 nm, that is, Λ=202.7 nm, and the depth of etching thereof is 0.03 micrometers. Therefore, distributed feedback coupling coefficient κ is approximately 70/cm.

The diffraction grating structure portion 40 constituting a resonator is divided into two regions, i.e., a first region 56 and a second region 58, by a flat phase shift portion 60 disposed at the central portion along the length, i.e., in the longitudinal direction, of the resonator. Width of the phase shift portion 60 is λ/8 (n=8). Therefore, in this example, there is a phase shift of an amount corresponding to λ/8, in the phase shift portion 60.

It should be noted that, in FIG. 5A, illustration of the phase shift portion is omitted for the sake of simplicity. The diffraction grating structure portion 40 and the phase shift portion 60 can be formed by using a well known electron beam exposure method and a well known photolithography technology.

As mentioned above, in the DFB laser 30 according to this example, there is provided the λ/8 phase shift portion 60. Therefore, it is possible to suppress a fluctuation of an optical output caused by the reflected return light. That is, it is possible to improve immunity against the reflected return light.

EXAMPLE 2

Figure 6A:
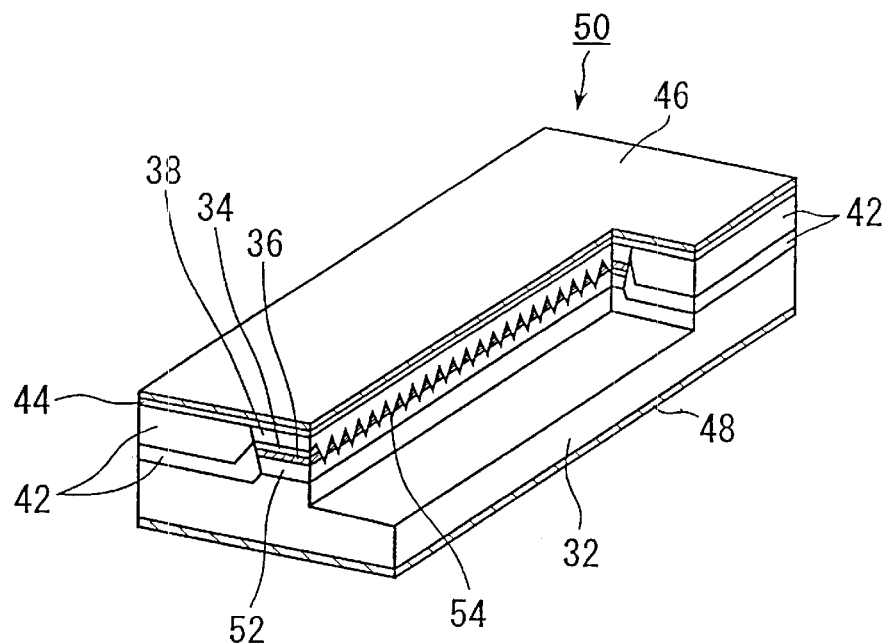
FIG. 6A is a partially cutaway perspective view illustrating a DFB laser according to still another embodiment of the present invention.
Figure 6B:
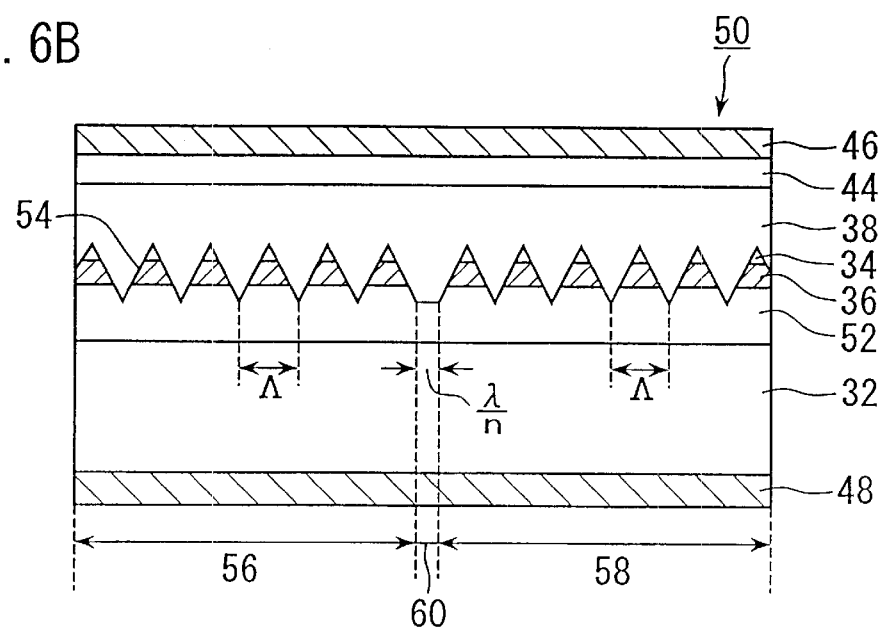
FIG. 6B is a schematic sectional view of the DFB laser shown in FIG. 6A.

With reference to FIG. 6A and FIG. 6B, an explanation will be made on a DFB laser according to an Example 2 which is generally designated by a reference numeral 50. FIG. 6A is a partially cutaway perspective view of the DFB laser 50 according to the Example 2. FIG. 6B is a schematic sectional view of the DFB laser 50 according to the Example 2 taken along the longitudinal direction of a resonator of the DFB laser 50.

As shown in FIGS. 6A and 6B, the DFB laser 50 has a resonator length of 250 micrometers (μm), and has a structure in which a first cladding layer 52, an active layer 36, a light guide or an optical guide layer 34, and a second cladding layer 38 are sequentially stacked on an InP semiconductor substrate 32. The first cladding layer 52 is made of InGaAsP and has a thickness of 1 micrometer. The active layer 36 has a multiple quantum well structure and has a thickness of 0.1 micrometer. The light guide layer 34 is made of InGaAsP and has a thickness of 0.05 micrometer. The second cladding layer 38 is made of InGaAsP and has a thickness of 2 micrometers. Each of these layers can be formed, for example, by using a well known epitaxial growth method.

Also, on both lateral sides of the first cladding layer 52, the active layer 36, the light guide layer 34 and the second cladding layer 38, a current block layer 42 is formed. On the second cladding layer 38 and the current block layer 42, there is formed a cap layer 44 made of InP and having a thickness of 3 micrometers.

Further, on the cap layer 44, there is formed an upper surface electrode 46, and on the back surface of the semiconductor substrate 32, there is formed a back surface electrode 48. Also, both end surfaces are coated with anti-reflection coating.

At the active layer 36, there is formed a diffraction grating structure portion 54 of gain coupling type. That is, a diffraction grating structure reaching from the first cladding layer 52 to the second cladding layer 38 is formed. By using such structure, a distribution of optical gain of the active layer 36 varies periodically along the length of the resonator. The period Λ of this diffraction grating structure portion 54 is 202.7 nm, that is, Λ=202.7 nm, and the depth of etching thereof is 0.15 micrometers. Therefore, distributed feedback coupling coefficient κ is approximately 70/cm.

The diffraction grating structure portion 54 constituting a resonator is divided into two regions, i.e., a first region 56 and a second region 58, by a flat phase shift portion 60 disposed at the central portion along the length of the resonator. Width of the phase shift portion 60 is λ/8 (n=8). Therefore, in this example, there is a phase shift of an amount corresponding to λ/8, in the phase shift portion 60.

It should be noted that, in FIG. 6A, illustration of the phase shift portion is omitted for the sake of simplicity. The diffraction grating structure portion 54 and the phase shift portion 60 can be formed by using a well known electron beam exposure method and a well known photolithography technology.

As mentioned above, in the DFB laser 50 according to this example, there is provided the λ/8 phase shift portion 60. Therefore, it is possible to suppress a fluctuation of an optical output caused by the reflected return light. That is, it is possible to improve immunity against the reflected return light.

EXAMPLE 3

Figure 7:
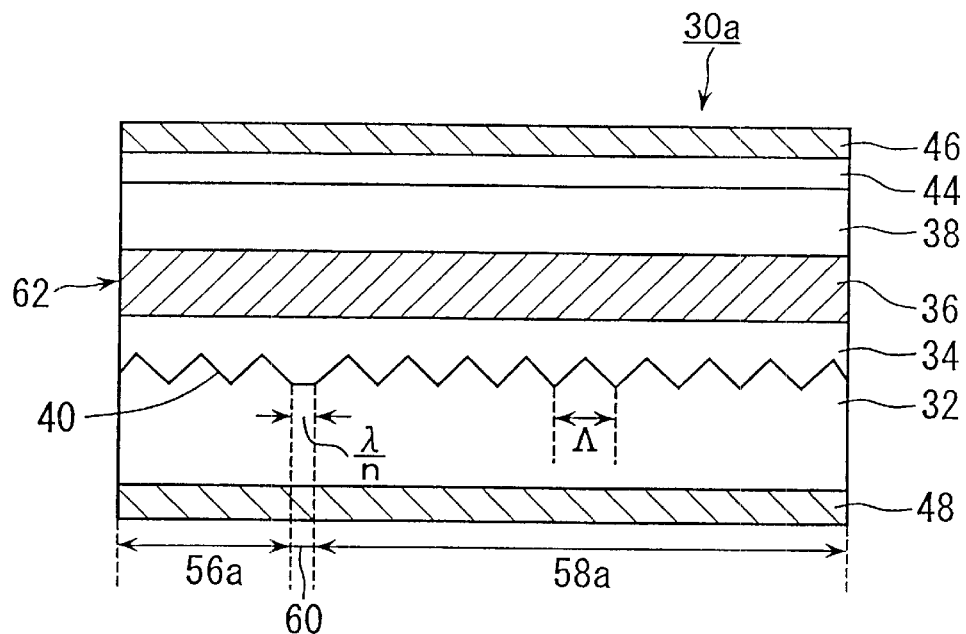
FIG. 7 is a schematic sectional view of the DFB laser according to still another embodiment of the present invention.

With reference to FIG. 7, an explanation will be made on a DFB laser according to an Example 3 which is generally designated by a reference numeral 30a. FIG. 7 is a schematic sectional view of the DFB laser 30a according to the Example 3 taken along the longitudinal direction of a resonator thereof. The structure of the DFB laser 30a according to the Example 3 is the same as that of the Example 1, except for the structure of a diffraction grating structure portion. Therefore, in FIG. 7, identical or corresponding pats are designated by the same reference numerals as those of the Example 1, and detailed explanation thereof is omitted.

In the DFB laser 30a of the Example 3, a phase shift portion 60 of λ/8 (n=8) is disposed at a portion which is shifted towards a front end surface 62 from the central portion, along the longitudinal direction of the resonator. The diffraction grating structure portion 40 constituting a resonator is divided into two regions, i.e., a first region 56a and a second region 58a, by this phase shift portion 60. The period π of this diffraction grating structure portion 40 in each of the first region 56a and the second region 58a is 202.7 nm, that is, Λ=202.7 nm, as in the Example 1.

In this way, in the Example 3, since the phase shift portion 60 is disposed at a portion near the front end surface 62, it becomes possible to raise an electric field strength at a portion near the front end surface 62 which is the emission end surface of the DFB laser. Therefore, in the DFB laser 30a of the Example 3, it is possible not only to improve the immunity against the reflected return light but also to improve output efficiency of the DFB laser.

EXAMPLE 4

Figure 8:
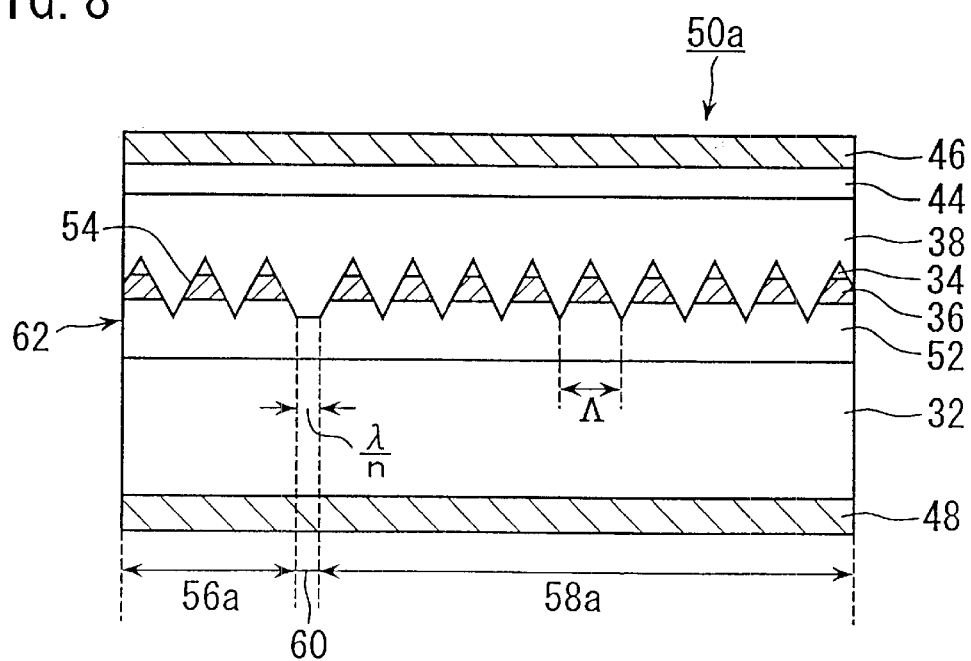
FIG. 8 is a schematic sectional view of the DFB laser according to still another embodiment of the present invention.

With reference to FIG. 8, an explanation will be made on a DFB laser according to an Example 4 which is generally designated by a reference numeral 50a. FIG. 8 is a schematic sectional view of the DFB laser 50a according to the Example 4 taken along the longitudinal direction of a resonator thereof. The structure of the DFB laser 50a according to the Example 4 is the same as that of the Example 2, except for the structure of a diffraction grating structure portion. Therefore, in FIG. 8, identical or corresponding pats are designated by the same reference numerals as those of the Example 2, and detailed explanation thereof is omitted.

In the DFB laser 50a of the Example 4, a phase shift portion 60 of λ/8 (n=8) is disposed at a portion which is shifted towards a front end surface 62 from the central portion, along the longitudinal direction of the resonator. The diffraction grating structure portion 54 constituting a resonator is divided into two regions, i.e., a first region 56a and a second region 58a, by this phase shift portion 60. The period Λ of the diffraction grating structure portion 54 of the gain coupling type in each of the first region 56a and the second region 58a is 202.7 nm, that is, Λ=202.7 nm, as in the Example 2.

In this way, in the Example 4, since the phase shift portion 60 is disposed at a portion near the front end surface 62, it becomes possible to raise an electric field strength at a portion near the front end surface 62 which is the emission end surface of the DFB laser. Therefore, in the DFB laser 50a of the Example 4, it is possible not only to improve the immunity against the reflected return light but also to improve output efficiency of the DFB laser.

EXAMPLE 5

Figure 9:
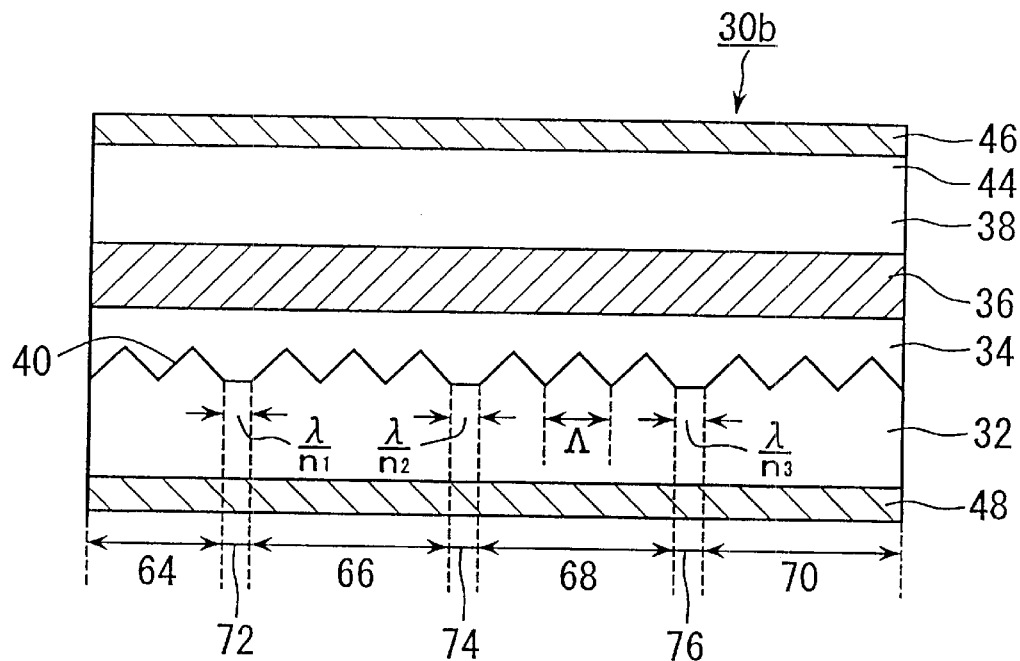
FIG. 9 is a schematic sectional view of the DFB laser according to still another embodiment of the present invention.

With reference to FIG. 9, an explanation will be made on a DFB laser according to an Example 5 which is generally designated by a reference numeral 30b. FIG. 9 is a schematic sectional view of the DFB laser 30b according to the Example 5 taken along the longitudinal direction of a resonator thereof. The structure of the DFB laser 30b according to the Example 5 is the same as that of the Example 1, except for the structure of a diffraction grating structure portion. Therefore, in FIG. 9, identical or corresponding pats are designated by the same reference numerals as those of the Example 1, and detailed explanation thereof is omitted.

In the DFB laser 30b of the Example 5, there are provided three phase shift portions. That is, a diffraction grating structure portion 40 is divided into four regions. Between a first region 64 and a second region 66, there is provided a first phase shift portion 72 of $\lambda/n_1$. Also, between a second region 66 and a third region 68, there is provided a second phase shift portion 74 of $\lambda/n_2$. Further, between a third region 68 and a fourth region 70, there is provided a third phase shift portion 76 of $\lambda/n_3$.

In the Example 5, the total phase shift ($\lambda/n_1+\lambda/n_2+\lambda/n_3$) which is the sum of the quantities of phase shift of the phase shift portions 72, 74 and 76 is determined to be λ/8. Also, the period Λ of the diffraction grating structure portion 40 in each of the regions 64, 66, 68 and 70 is 202.7 nm, that is, Λ=202.7 nm, as in the Example 1.

In this way, in the Example 5, since there are provided a plurality of phase shift portions, it becomes possible to disperse concentration of electric field in the phase shift portions and to uniformalize a distribution of the electric field within the DFB laser 30b. As a result, it is possible to uniformalize a carrier distribution. Therefore, in the DFB laser 30b of the Example 5, it is possible not only to improve the immunity against the reflected return light, but also to suppress occurrence of spatial hole burning.

EXAMPLE 6

Figure 10:
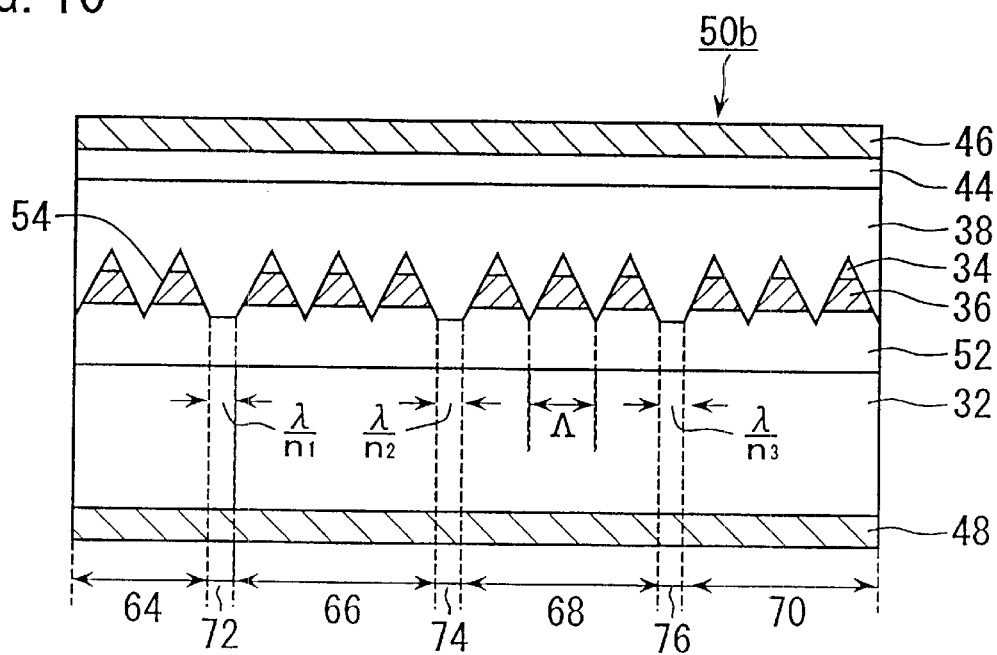
FIG. 10 is a schematic sectional view of the DFB laser according to still another embodiment of the present invention.

With reference to FIG. 10, an explanation will be made on a DFB laser according to an Example 6 which is generally designated by a reference numeral 50b. FIG. 10 is a schematic sectional view of the DFB laser 50b according to the Example 6 taken along the longitudinal direction of a resonator thereof. The structure of the DFB laser 50b according to the Example 6 is the same as that of the Example 2, except for the structure of a diffraction grating structure portion. Therefore, in FIG. 10, identical or corresponding pats are designated by the same reference numerals as those of the Example 2, and detailed explanation thereof is omitted.

In the DFB laser 50b of the Example 6, there are provided three phase shift portions. That is, a diffraction grating structure portion 54 is divided into four regions. Between a first region 64 and a second region 66, there is provided a first phase shift portion 72 of $\lambda/n_1$. Also, between a second region 66 and a third region 68, there is provided a second phase shift portion 74 of $\lambda/n_2$. Further, between a third region 68 and a fourth region 70, there is provided a third phase shift portion 76 of $\lambda/n_3$.

In the Example 6, the total phase shift $(\lambda/n_1+\lambda/n_2+\lambda/n_3)$ which is the sum of the quantities of phase shift of the phase shift portions 72, 74 and 76 is determined to be $\lambda/8$. Also, the period $\pi$ of the diffraction grating structure portion 54 in each of the regions 64, 66, 68 and 70 is 202.7 nm, that is, $\Lambda$=202.7 nm, as in the Example 2.

In this way, in the Example 6, since there are provided a plurality of phase shift portions, it becomes possible to disperse concentration of electric field in the phase shift portions and to uniformalize a distribution of the electric field within the DFB laser 50b. As a result, it is possible to uniformalize a carrier distribution. Therefore, in the DFB laser 50b of the Example 6, it is possible not only to improve the immunity against the reflected return light, but also to suppress occurrence of spatial hole burning.

EXAMPLE 7

Figure 11A:
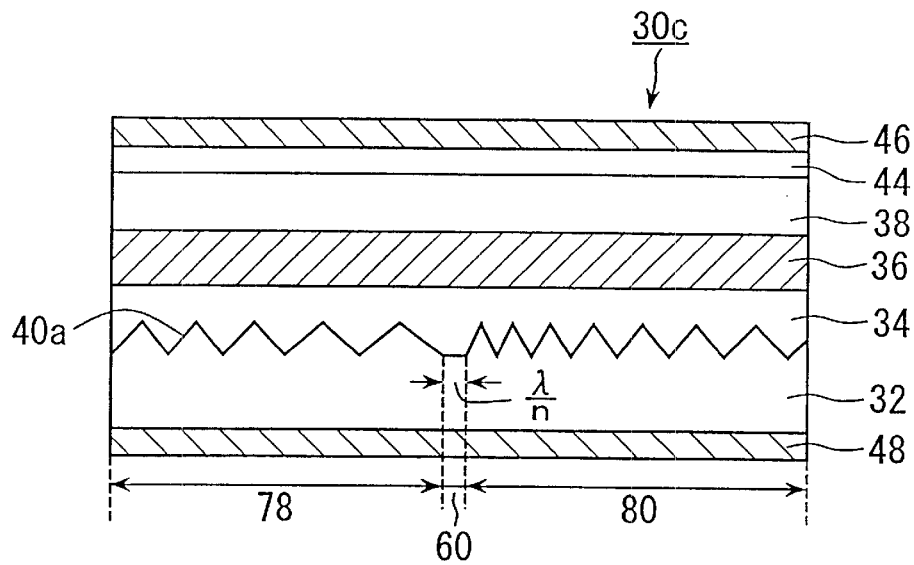
FIG. 11A is a schematic sectional view of the DFB laser according to still another embodiment of the present invention.
Figure 11B:
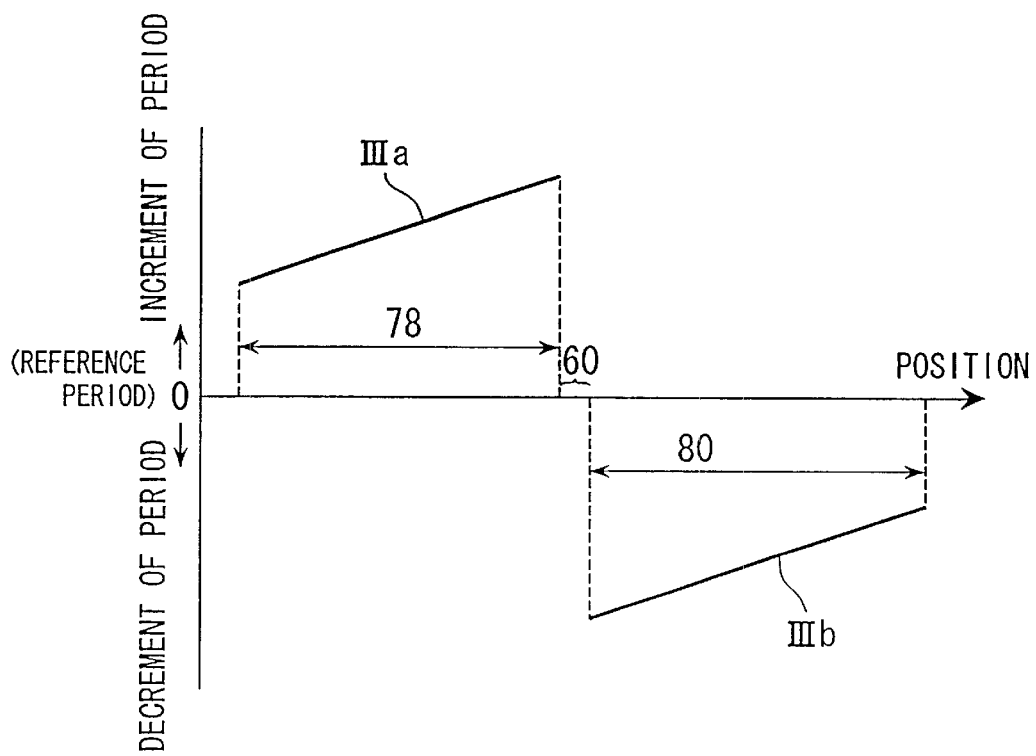
FIG. 11B is a graph illustrating quantity of increase and decrease of a period of a diffraction grating in the DFB laser of FIG. 11A.

With reference to FIG. 11A and FIG. 11B, an explanation will be made on a DFB laser according to an Example 7 which is generally designated by a reference numeral 30c. FIG. 11A is a schematic sectional view of the DFB laser 30c according to the Example 7 taken along the longitudinal direction of a resonator thereof. FIG. 11B is a graph illustrating quantity of increase and decrease of a period of a diffraction grating in the DFB laser 30c. The structure of the DFB laser 30c according to the Example 7 is the same as that of the Example 1, except for the structure of a diffraction grating structure portion. Therefore, in FIG. 11A and FIG. 11B, identical or corresponding pats are designated by the same reference numerals as those of the Example 1, and detailed explanation thereof is omitted.

In the DFB laser 30c of the Example 7, a phase shift portion 60 of $\lambda/8$ (n=8) is disposed at the central portion along the longitudinal direction of a resonator. The diffraction grating structure portion 40a constituting the resonator is divided into two regions, i.e., a first region 78 and a second region 80 via the phase shift portion 60 therebetween.

In the DFB laser 30c, an average period of a diffraction grating structure 40a in the first region 78 and in the second region 80 is determined to be a reference period. Also, as shown by a line IIIa in the graph of FIG. 11B, the period of the diffraction grating structure in the first region 78 is increased with respect to the reference period. On the other hand, as shown by a line IIIb in the graph of FIG. 11B, the period of the diffraction grating structure in the second region 80 is decreased with respect to the reference period.

Also, as shown by the line IIIa and the line IIIb, an increment and decrement of the period in the first region 78 and in the second region 80 of the diffraction grating structure 40a with respect to the reference period at equal distances from the phase shift portion 60 are made equal to each other. Also, the quantity of phase shift of the phase shift portion 60 is determined to be a quantity corresponding to $\lambda/8$ (n=8) with respect to the reference period.

By using the diffraction grating structure 40a having the above-mentioned structure, it becomes possible to alleviate concentration of electric field in the phase shift portion and to uniformalize a distribution of the electric field within the DFB laser 30c. As a result, it is possible to uniformalize a carrier distribution. Therefore, in the DFB laser 30c of the Example 7, it is possible not only to improve the immunity against the reflected return light, but also to suppress occurrence of spatial hole burning.

It should be noted that each of the increment and the decrement of a period with respect to the reference period may be a negative value. Also, it is not always necessary for the increment and the decrement of the period to vary linearly with respect to the distance from the phase shift portion 60.

EXAMPLE 8

Figure 12A:
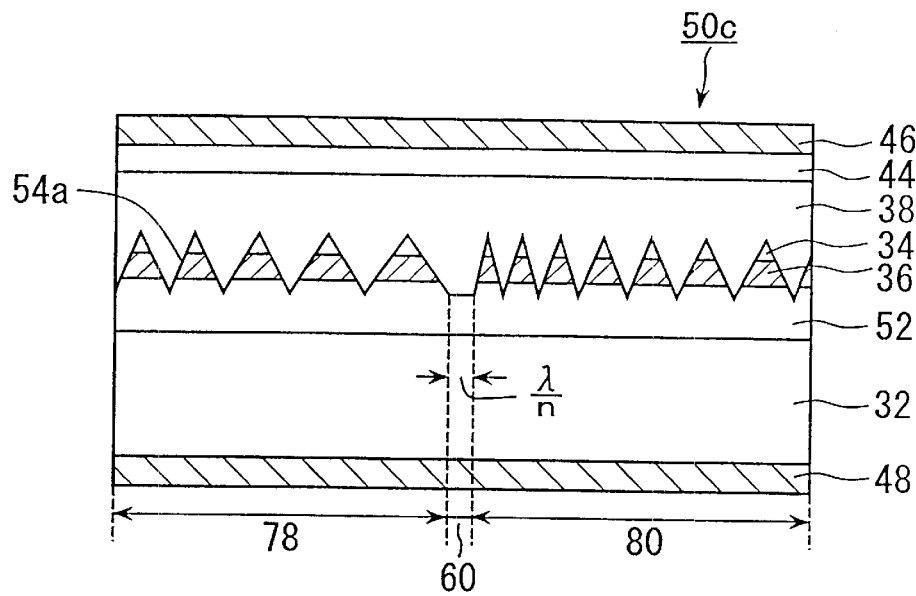
FIG. 12A is a schematic sectional view of the DFB laser according to still another embodiment of the present invention.
Figure 12B:
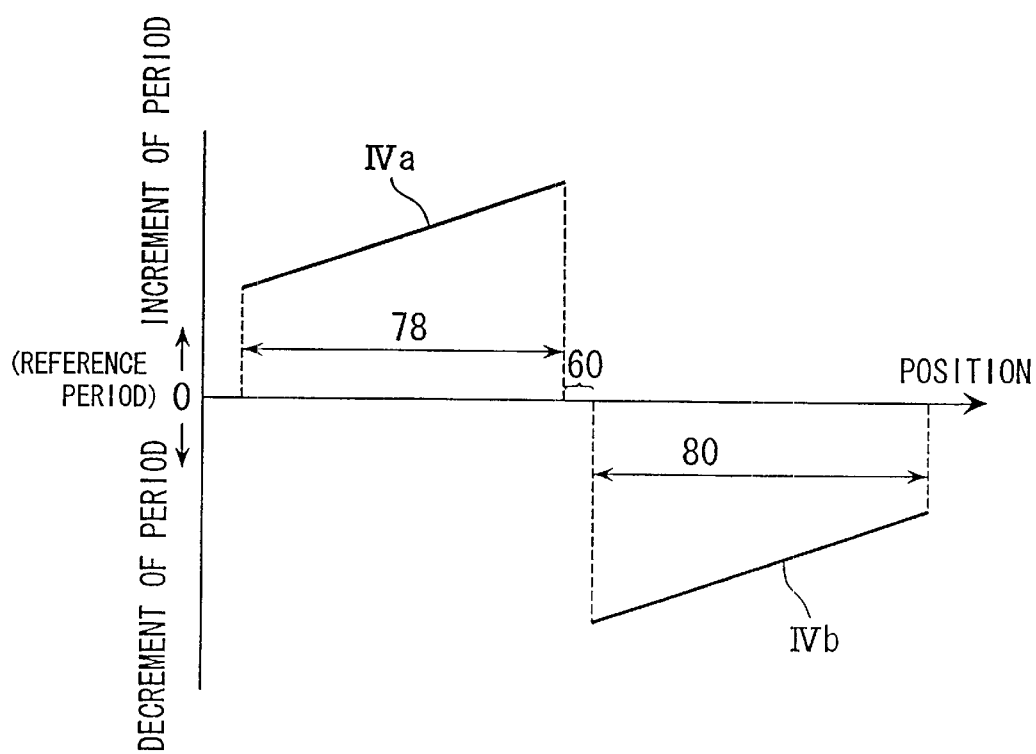
FIG. 12B is a graph illustrating quantity of increase and decrease of a period of a diffraction grating in the DFB laser of FIG. 12A.

With reference to FIG. 12A and FIG. 12B, an explanation will be made on a DFB laser according to an Example 8 which is generally designated by a reference numeral 50c. FIG. 12A is a schematic sectional view of the DFB laser 50c according to the Example 8 taken along the longitudinal direction of a resonator thereof. FIG. 12B is a graph illustrating quantity of increase and decrease of a period of a diffraction grating in the DFB laser 50c. The structure of the DFB laser 50c according to the Example 8 is the same as that of the Example 2, except for the structure of a diffraction grating structure portion. Therefore, in FIG. 12A and FIG. 12B, identical or corresponding pats are designated by the same reference numerals as those of the Example 2, and detailed explanation thereof is omitted.

In the DFB laser 50c of the Example 8, a phase shift portion 60 of $\lambda/8$ (n=8) is disposed at the central portion along the longitudinal direction of a resonator. The diffraction grating structure portion 54a constituting the resonator is divided into two regions, i.e., a first region 78 and a second region 80 via the phase shift portion 60 therebetween.

In the DFB laser 50c, an average period of a diffraction grating structure 54a in the first region 78 and in the second region 80 is determined to be a reference period. Also, as shown by a line IVa in the graph of FIG. 12B, the period of the diffraction grating structure in the first region 78 is increased with respect to the reference period. On the other hand, as shown by a line IVb in the graph of FIG. 12B, the period of the diffraction grating structure in the second region 80 is decreased with respect to the reference period.

Also, as shown by the line IVa and the line IVb, an increment and decrement of the period in the first region 78 and in the second region 80 of the diffraction grating structure 54a with respect to the reference period at equal distances from the phase shift portion 60 are made equal to each other. 20 Also, the quantity of phase shift of the phase shift portion 60 is determined to be a quantity corresponding to $\lambda/8$ (n=8) with respect to the reference period.

By using the diffraction grating structure 54a having the above-mentioned structure, it becomes possible to alleviate concentration of electric field in the phase shift portion and to uniformalize a distribution of the electric field within the DFB laser 50c. As a result, it is possible to uniformalize a carrier distribution. Therefore, in the DFB laser 50c of the Example 8, it is possible not only to improve the immunity against the reflected return light, but also to suppress occurrence of spatial hole burning.

It should be noted that each of the increment and the decrement of a period with respect to the reference period may be a negative value. Also, it is not always necessary for the increment and the decrement of the period to vary linearly with respect to the distance from the phase shift portion 60.

EXAMPLE 9

Figure 13:
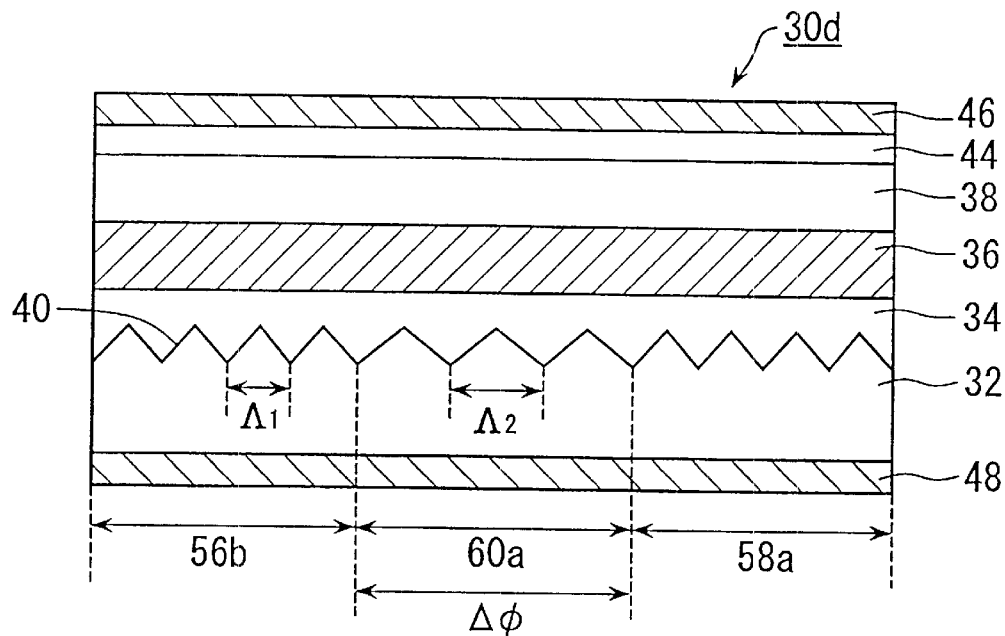
FIG. 13 is a schematic sectional view of the DFB laser according to still another embodiment of the present invention.

With reference to FIG. 13, an explanation will be made on a DFB laser according to an Example 9 which is generally designated by a reference numeral 30d. FIG. 13 is a schematic sectional view of the DFB laser 30d according to the Example 9 taken along the longitudinal direction of a resonator thereof. The structure of the DFB laser 30d according to the Example 9 is the same as that of the Example 1, except for the structure of a diffraction grating structure portion. Therefore, in FIG. 13, identical or corresponding pats are designated by the same reference numerals as those of the Example 1, and detailed explanation thereof is omitted.

In the DFB laser 30d of the Example 9, a phase shift portion 60a is disposed at the central portion along the longitudinal direction of a resonator. The diffraction grating structure portion 40 constituting the resonator is divided into two regions, i.e., a first region 56b and a second region 58b via the phase shift portion 60a therebetween. In the phase shift portion 60a, a diffraction grating is provided which has a period Λ2 different from a period Λ1 of a diffraction grating in each of the first region 56b and second region 58b. In the diffraction grating of the phase shift portion 60a, there occurs a phase shift of Δϕ corresponding to λ/8 (n=8).

As mentioned above, according to the Example 9, since the phase shift portion 60a is constituted by using a diffraction grating structure having a period different from that of other portions, it becomes possible to enlarge the width of the phase shift portion 60a along the longitudinal direction of the resonator. Therefore, it is possible to alleviate concentration of electric field in the phase shift portion 60a and to uniformalize a distribution of the electric field within the DFB laser 30d. As a result, it is possible to uniformalize a carrier distribution. Therefore, in the DFB laser 30d of the Example 9, it is possible not only to improve the immunity against the reflected return light, but also to suppress occurrence of spatial hole burning.

EXAMPLE 10

Figure 14:
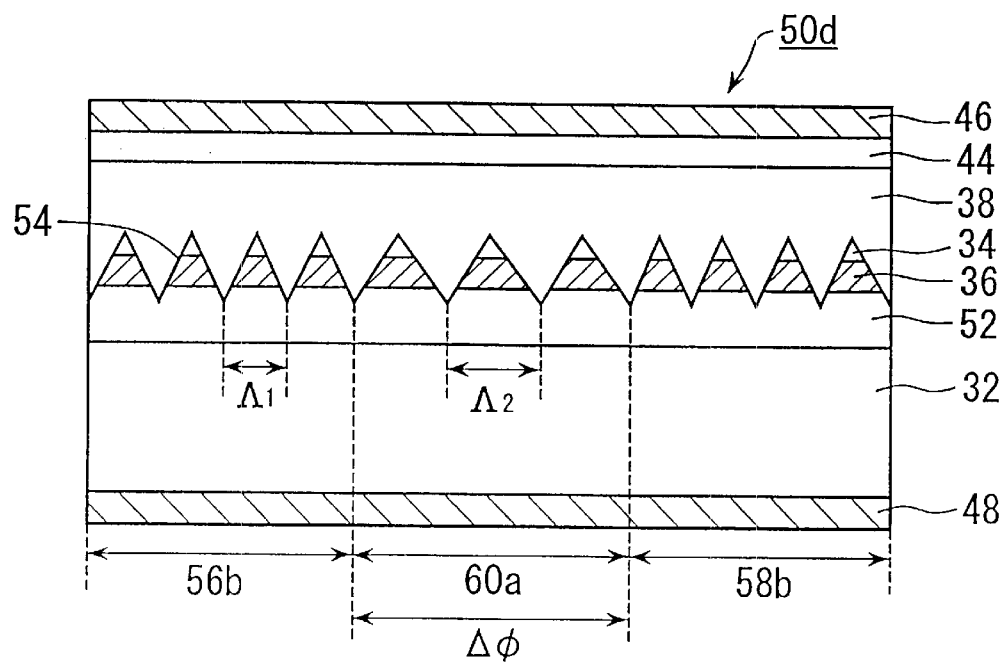
FIG. 14 is a schematic sectional view of the DFB laser according to still another embodiment of the present invention.

With reference to FIG. 14, an explanation will be made on a DFB laser according to an Example 10 which is generally designated by a reference numeral 50d. FIG. 14 is a schematic sectional view of the DFB laser 50d according to the Example 10 taken along the longitudinal direction of a resonator thereof. The structure of the DFB laser 50d according to the Example 10 is the same as that of the Example 2, except for the structure of a diffraction grating structure portion. Therefore, in FIG. 14, identical or corresponding pats are designated by the same reference numerals as those of the Example 2, and detailed explanation thereof is omitted.

In the DFB laser 50d of the Example 10, a phase shift portion 60a is disposed at the central portion along the longitudinal direction of a resonator. The diffraction grating structure portion 40 constituting the resonator is divided into two regions, i.e., a first region 56b and a second region 58b via the phase shift portion 60a therebetween. In the phase shift portion 60a, a diffraction grating is provided which has a period Λ2 different from a period Λ1 of a diffraction grating in each of the first region 56b and second region 58b. In the diffraction grating of the phase shift portion 60a, there occurs a phase shift of Δϕ corresponding to λ/8 (n=8).

As mentioned above, according to the Example 10, since the phase shift portion 60a is constituted by using a diffraction grating structure having a period different from that of other portions, it becomes possible to enlarge the width of the phase shift portion 60a along the longitudinal direction of the resonator. Therefore, it is possible to alleviate concentration of electric field in the phase shift portion 60a and to uniformalize a distribution of the electric field within the DFB laser 50d. As a result, it is possible to uniformalize a carrier distribution. Therefore, in the DFB laser 50d of the Example 10, it is possible not only to improve the immunity against the reflected return light, but also to suppress occurrence of spatial hole burning.

As mentioned in detail above, according to the present invention, since the quantity of phase shift is selected to be a value smaller than a quantity corresponding to λ/4, it is possible to suppress fluctuation of an optical output of the DFB laser caused by the reflected return light. That is, it is possible to improve the immunity of the DFB laser against the reflected return light.

In the foregoing specification, the invention has been described with reference to specific embodiments and examples constituted in various conditions. However, one of ordinary skill in the art appreciates that various modifications and changes can be made without departing from the scope of the present invention as set forth in the claims below. For example, in the above examples, the quantity of phase shift is determined to be λ/8 (n=8). However, in the present invention, the quantity of phase shift can be any value smaller than λ/4 and is not limited to the value described above. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A distributed feedback semiconductor laser comprising:
   a diffraction grating structure portion which constitutes a resonator and which is divided into a plurality of regions along the longitudinal direction of said resonator; and
   one or more phase shift portions each disposed between adjacent regions of said diffraction grating structure portion;
   wherein total phase shift obtained by all of said phase shift portions has a quantity corresponding to λ/n, where λ is an oscillation wavelength, and n is an integer larger than 4 (n>4) and less than or equal to 16 (n≦16).

2. A distributed feedback semiconductor laser as set forth in claim 1, wherein said total phase shift has a quantity corresponding to a value within a range between λ/5 and λ/8.

3. A distributed feedback semiconductor laser as set forth in claim 1, wherein said diffraction grating structure portion is divided into a first region and a second region and wherein a phase shift portion is provided between said first and second regions.

4. A distributed feedback semiconductor laser as set forth in claim 3,
   wherein said phase shift portion is disposed at the central portion along the longitudinal direction of said resonator,
   wherein an average period of all of said first and second regions of said diffraction grating structure portion is determined as a reference period,
   wherein a period of said first region of said diffraction grating structure portion is increased with respect to said reference period, and a period of said second region of said diffraction grating structure portion is decreased with respect to said reference period, and
   wherein an increment of said period of said diffraction grating structure portion in said first region and a decrement of said period of said diffraction grating structure portion in said second region at any equal distances from said phase shift portion are equal to each other.

5. A distributed feedback semiconductor laser as set forth in claim 3, wherein said phase shift portion is disposed at a portion shifted toward the front end surface from the central portion along the longitudinal direction of said resonator.

6. A distributed feedback semiconductor laser as set forth in claim 1, wherein said diffraction grating structure portion is divided into at least three regions and wherein a phase shift portion is provided each between adjacent regions.

7. A distributed feedback semiconductor laser as set forth in claim 1, wherein said phase shift portion has a phase shifting diffraction grating structure which has a period different from that of said diffraction grating structure portion in said plurality of regions.

8. A distributed feedback semiconductor laser as set forth in claim 1, wherein said diffraction grating structure portion is formed at an interface portion between an optical guide layer and another layer adjacent said optical guide layer.

9. A distributed feedback semiconductor laser comprising:
   a diffraction grating structure portion of gain coupling type which constitutes a resonator, which is divided into a plurality of regions along the longitudinal direction of said resonator, and in which optical gain distribution of an active layer varies periodically along the longitudinal direction of said resonator; and
   one or more phase shift portions each disposed between adjacent regions of said diffraction grating structure portion;
   wherein total phase shift obtained by all of said phase shift portions has a quantity corresponding to $\lambda/n$, where $\lambda$ is an oscillation wavelength, and n is an integer larger than 4 (n>4) and less than or equal to 16 (n≦16).

10. A distributed feedback semiconductor laser as set forth in claim 9, wherein said total phase shift has a quantity corresponding to a value within a range between $\lambda/5$ and $\lambda/8$.

11. A distributed feedback semiconductor laser as set forth in claim 9, wherein said diffraction grating structure portion is divided into a first region and a second region and wherein a phase shift portion is provided between said first and second regions.

12. A distributed feedback semiconductor laser as set forth in claim 11,
   wherein said phase shift portion is disposed at the central portion along the longitudinal direction of said resonator,
   wherein an average period of all of said first and second regions of said diffraction grating structure portion is determined as a reference period,
   wherein a period of said first region of said diffraction grating structure portion is increased with respect to said reference period, and a period of said second region of said diffraction grating structure portion is decreased with respect to said reference period, and
   wherein an increment of said period of said diffraction grating structure portion in said first region and a decrement of said period of said diffraction grating structure portion in said second region at any equal distances from said phase shift portion are equal to each other.

13. A distributed feedback semiconductor laser as set forth in claim 11, wherein said phase shift portion is disposed at a portion shifted toward the front end surface from the central portion along the longitudinal direction of said resonator.

14. A distributed feedback semiconductor laser as set forth in claim 9, wherein said diffraction grating structure portion is divided into at least three regions and wherein a phase shift portion is provided each between adjacent regions.

15. A distributed feedback semiconductor laser as set forth in claim 9, wherein said phase shift portion has a phase shifting diffraction grating structure which has a period different from that of said diffraction grating structure portion in said plurality of regions.

\* \* \* \* \*